United States Patent [19]

Vu

[11] Patent Number: 4,845,679

[45] Date of Patent: Jul. 4, 1989

[54] DIODE-FET LOGIC CIRCUITRY

[75] Inventor: Tho T. Vu, Fridley, Minn.

[73] Assignee: Honeywell Inc., Minneapolis, Minn.

[21] Appl. No.: 32,127

[22] Filed: Mar. 30, 1987

[51] Int. Cl.[4] .................. G11C 8/00; G11C 11/36; G11C 17/00; H03K 19/094

[52] U.S. Cl. .................. 365/189.02; 365/175; 365/94; 365/189.11; 365/230.06; 307/450; 307/457

[58] Field of Search .............. 365/230, 175, 177, 94; 307/460, 450, 457, 304

[56] References Cited

U.S. PATENT DOCUMENTS

| | | | |
|---|---|---|---|
| 3,245,051 | 4/1966 | Robb | 365/105 |
| 3,373,406 | 3/1968 | Cannon et al. | 365/105 |
| 3,626,389 | 12/1971 | Waaben | 307/238 |
| 4,070,654 | 1/1978 | Tachi | 365/104 |
| 4,240,151 | 12/1980 | Kawagoe | 365/104 |
| 4,312,046 | 1/1982 | Taylor | 365/104 |
| 4,342,102 | 7/1982 | Puar | 365/207 |
| 4,347,585 | 8/1982 | Eardley | 365/105 |
| 4,385,368 | 5/1983 | Principi et al. | 365/105 |
| 4,404,480 | 9/1988 | Ransom et al. | 307/450 |
| 4,479,200 | 10/1984 | Sato et al. | 365/175 |
| 4,534,008 | 8/1985 | Fuchs et al. | 364/716 |
| 4,554,640 | 11/1985 | Wong et al. | 364/716 |

Primary Examiner—Terrell W. Fears
Assistant Examiner—Melissa J. Koval
Attorney, Agent, or Firm—John G. Shudy, Jr.

[57] ABSTRACT

Exclusive diode-FET logic circuitry capable of providing functional programmable logic array output logic signals within one-gate delay from an initial input logic signal, and functional read-only memory output data signals within two- or three-gate delay from an initial input address signal. The OR and AND functions of the circuit are performed by diode configurations thus resulting in high packing density, easy logic array programming, low power dissipation, and high speed operations. The invention may utilize Schottky diodes and metal semiconductor FETs thereby allowing the implementation of high speed gallium arsenide integrated circuit technology.

11 Claims, 4 Drawing Sheets

CIRCUIT DIAGRAM

LOGIC DIAGRAM

CIRCUIT DIAGRAM    LOGIC DIAGRAM

DIODE-FET LOGIC CIRCUITRY

BACKGROUND OF THE INVENTION

The invention relates to computer-logic circuitry, and more particularly programmable logic array (PLA) and read-only memory (ROM) circuitry. Even more particularly, the present invention concerns PLA and ROM circuitry constructed with only diodes and field effect transistors (FETs).

In the development of integrated circuit (IC) technology, a family of at least three types of computer circuitry are needed: random access memories (RAMs), ROMs, and logic circuits. To date, all these types of circuitry have been developed and implemented in IC technology.

Gallium arsenide (GaAs) technology has been of particular interest because of the enhanced speeds active circuit components exhibit compared to those of silicon IC technology. So far, GaAs IC technology has been extensively developed for RAMs and some logic circuits, but not for PLAs or ROMs. The latter lack of development precludes exclusive use of gallium arsenide's advantage in speed in computer and signal processing systems.

SUMMARY OF THE INVENTION

The present invention is a circuit that has the capability of providing both PLA and ROM functions having circuits consisting merely of diodes, FETs, and of course, interconnecting conductors. Thus using Schottky diodes and metal semiconductor FETs, the invention can implement various kinds of GaAs ICs. Also the invention maintains the advantage of GaAs high speed capability by keeping the number of circuit gate delays low.

The PLA has, from input to output, excluding a buffer, effectively no gate delays. The ROM function has, from input address to data out, only two- or three-gate delays, depending on the kind of address, excluding output interface circuitry. The output interface or buffer circuitry in either case adds only one gate delay.

The diodes are utilized to perform OR and AND operations in the invention. FETs are used in current sources and sinks, and in driver circuits. The OR and AND planes of the PLA function are implemented using Schottky diodes. In the ROM function, these OR and AND operations are implemented throughout the whole ROM for addressing, decoding, reading and multiplexing data.

Prior art, "MESFET PLA's for GaAs and VLSI Integrated Circuits," E. H. Perea, G. Nuzittat and C. Arnods, *GaAs IC Syposium* 1982, shows a PLA implementing GaAs semiconductor technology; however, the PLA uses a metal semiconductor FET as a logic element. Use of Schottky diodes in the invention provides more logical functions per plane than the use of metal semiconductor FETS. Schottky diodes also result in higher density, less power dissipation and faster arithmetic. PLA's using diodes for logic functions allows easier programming. It is more efficient to eliminate diodes with a laser than to remove FETs in the OR or AND circuits to obtain a desired logic array.

The invention may be applicable to any solid state semiconductor technology, including that involving high speed or low power techniques, and to different families of the PLA and ROM, including FPLA, PROM, EPROM, etc.

The invention is suitable with FETs using any type of process including depletion, enhancement, or a combination of depletion and enhancement. If the invention is used with enhancement or a combination of depletion and enhancement field effect transistors, only one power supply and a ground reference are required. The invention is centered around Schottky diode-FET logic (SDFL), but is suitable for other FET circuit families including buffered FET logic (BFL), source-coupled FET logic (SCFL) and direct-coupled FET logic (DCFL).

DESCRIPTION OF THE PREFERRED EMBODIMENTS

Figure 1:
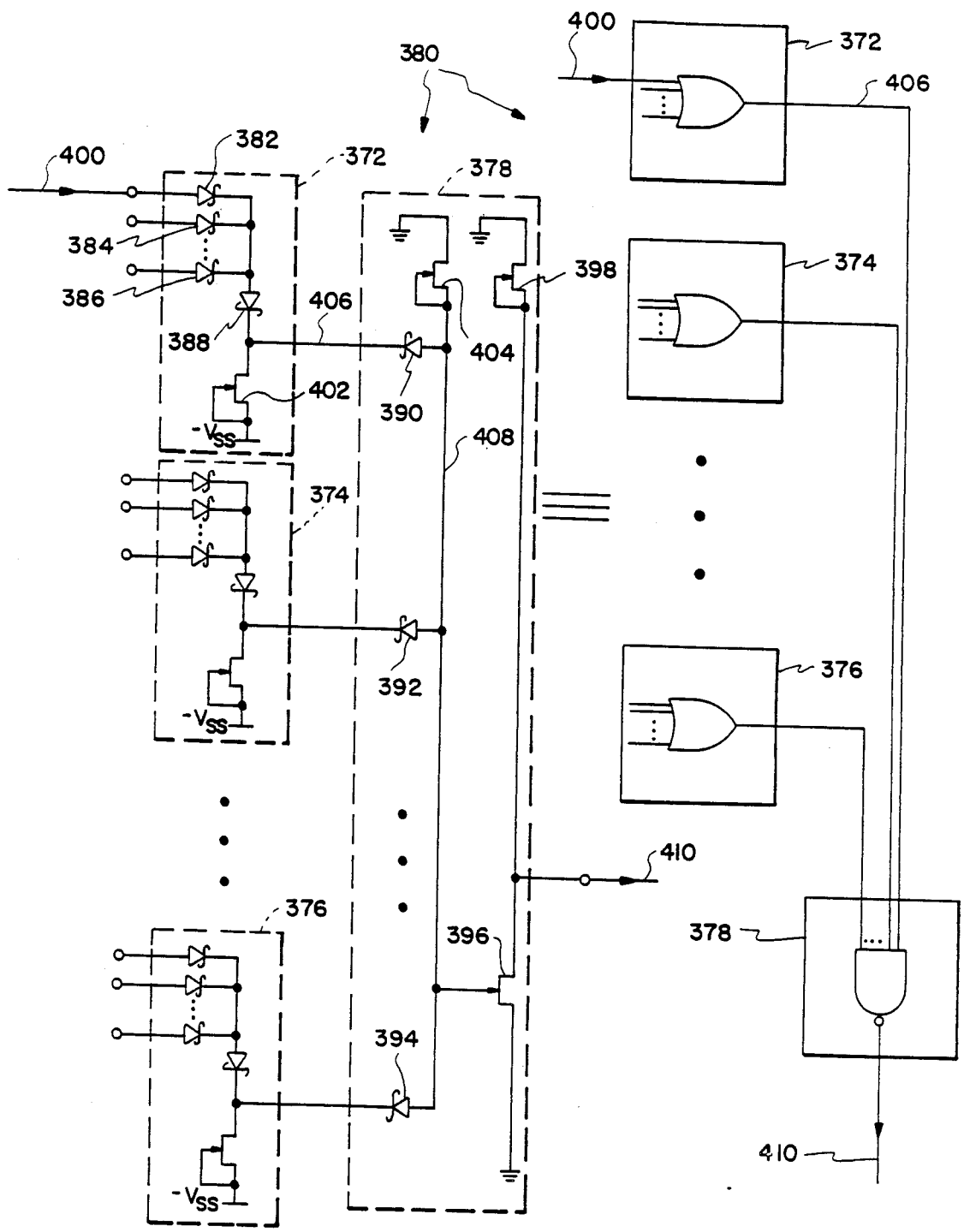
FIG. 1 shows circuit and logic diagrams for an OR-/AND plane.

FIG. 1 illustrates an OR/AND plane 380 for the PLA. The circuit uses only diodes with the exception of one inverting FET and the pull down and pull up FET's utilized in the current sources and sinks. This OR/AND configuration 380 is of great advantage because there is no gate delay in the exclusive diode OR/AND circuit 380. The only gate delay involved is the inverter comprising FETs 396 and 398.

Circuit 372 of FIG. 1 performs an OR function. A high logic signal is put into input 400 forward biasing diode 382 and diode 388 thereby presenting a high signal on line 406 less only the voltage drops of diodes 382 and 388. The signal remains high on line 406 even though inputs into diodes 384 and 386 are low. If the input at 400 is also low, diodes 382 and 388 are not forward-biased and do not conduct. Line 406 is then kept to a low logic state by a current sink incorporating FET 402 having its drain connected to the cathode of diode 390 and its gate and source connected to a negative voltage potential $-V_{SS}$. The anode of diode 390 is connected to a constant current source composed of FET 404 having its drain connected to a ground or a voltage potential $V_D$. (Ground is used in FIG. 1 for Schottky diode FET logic; but a different voltage supply $V_D$ can be designed for different circuit families depending on requirements.) The gate and source of FET 404 are connected to the anode of diode 390. With no high signal coming into diode 388, all the current flowing through FET 402 flows through diode 390 from FET 404. If less than all inputs are low, the output of circuit 372 on line 406 is a high signal. OR circuits 374 and 376 function like the OR circuit 372.

Circuit 378 performs logical AND functions. If an input on line 406 of diode 390 is a high logic signal, 390 is back-biased and has no effect on line 408. Current flows from FET 404 through line 408 through forward-biased diodes 392 and 394 so long as the inputs at diodes 392 and 394 are low. The current flowing through diodes 392 and 394 goes to current sinks similar to that made up of FET 402 of circuit 372, which is connected to negative voltage potential $-V_{SS}$. If the inputs to diodes 390 and 392 are high, line 408 still remains low because the current from the constant current source made up of FET 404 flows on through diode 394, having a low input, on to a current sink, which holds 408 down to a low logic state. However, if the inputs to diodes 390, 392 and 394 are high then no current is flowing to any of the three current sinks. FET 404 pulls up line 408 to a high logic state. Thus, only when all of the inputs to circuit 378 are high will the logic state on line 408 be high revealing circuit 378 to perform an AND function.

The signal on line 408 goes to the gate of FET 396. The drain of FET 396 is connected to a constant current source composed of FET 398 and positive voltage potential $V_{DD}$. The source of FET 396 is connected to ground. FET 396 is a switching transistor which transforms the signal on line 408 to inverted signal on output 410. Because of the inversion of the AND signal on line 408 by FET 396, circuit 378 is a NAND logic circuit.

Figure 2:
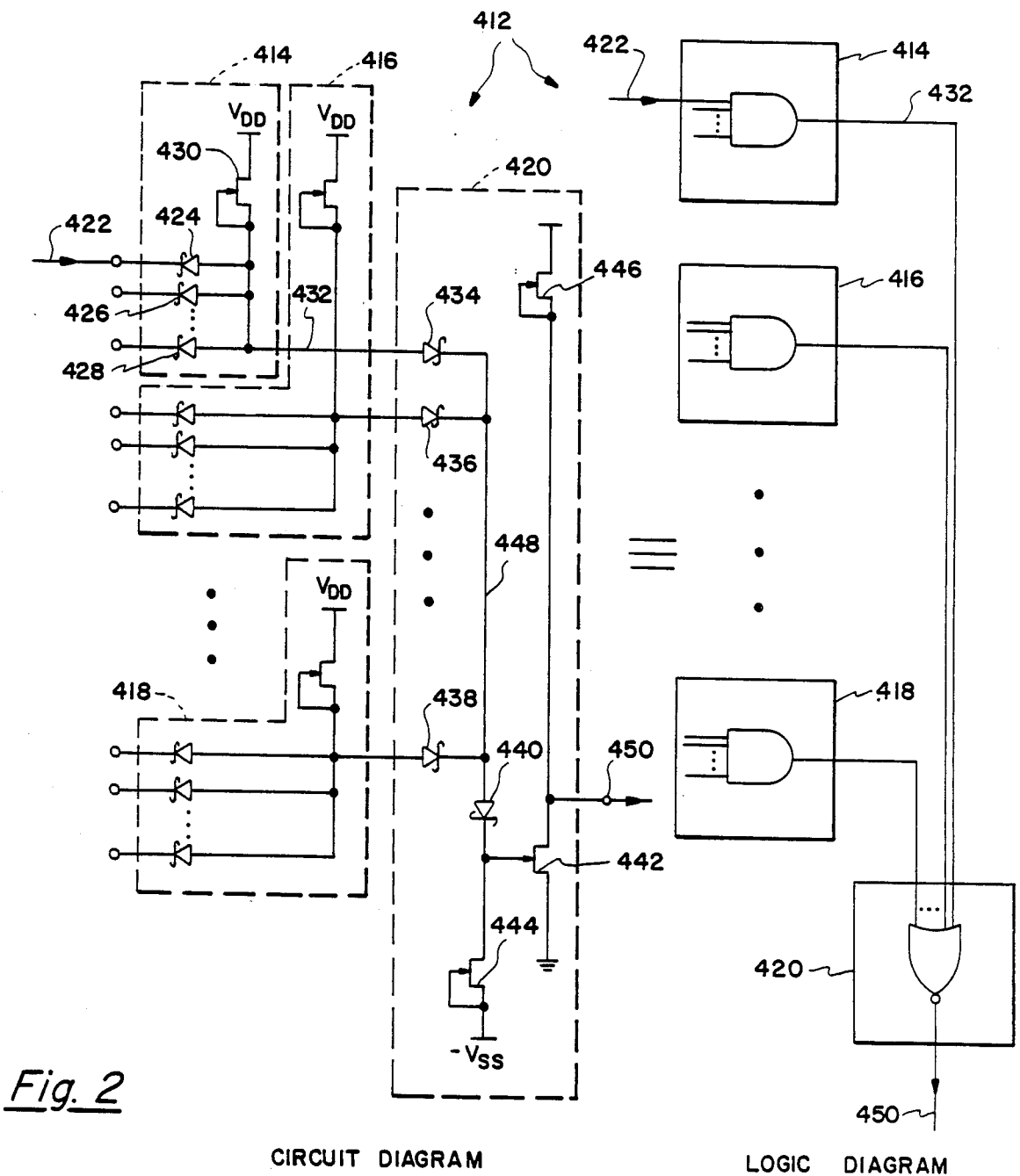
FIG. 2 shows circuit and logic diagrams for an AND-/OR plane.

Circuit 412 in FIG. 2 illustrates an AND/OR plane which can be used in the PLA. Circuits 414, 416 and 418 are AND logic circuits. For instance in AND circuit 414, if a high logic level input is on 422 and a low logic input is coming into the cathodes of diodes 426 through 428, the output line 432 will be in a low logic state. Current flowing from the constant current source composed of FET 430 and positive voltage potential $V_{DD}$, through forward-biased diodes 426 through 428 to the low inputs of circuit 414 keep the voltage level of line 432 at a low. If all inputs to circuit 414 are high except for one, the current will flow through the one diode to the low input of circuit 414. However, if all the inputs to circuit 414 are high, line 432 will be high because no current will be flowing from the constant current source, incorporating FET 430. Current will be along line 432 through diode 434 along line 448 through diode 440 to a current sink made up of FET 444 and a negative voltage potential $-V_{SS}$. Under this condition, line 432 is pulled up by FET 430 to a high state thus resulting in an AND output indicating a high logic state of all of the inputs of circuit 414. AND circuits 416 through 418 function like circuit 414.

Circuit 420 of FIG. 2 is a NOR logic circuit. If the input to diode 434 is high and the inputs to diodes 436 through 438 are low, line 448 is high because the reverse biased diodes 436 through 438 have no effect on the high signal coming from the forward-biased diode 434. The only way that line 448 can be low is for all the inputs of circuit 420 to diodes 434, 436 through 438 to be low. Line 448 is then pulled down a low state due to a pull-down FET 444 which is connected to a negative voltage potential $-V_{SS}$ composing a current sink. Any current on line 448 goes through diode 440. If the voltage potential on line 448 is high then the voltage on the gate of FET 442 is high and, correspondingly, if the voltage potential on line 448 is low then the voltage potential on the gate of FET 442 is low. If the signal on FET 442 is low, the output signal at 450 of circuit 420 is high because the FET 442 is turned off and FET 446 pulls up the voltage through its connection to the positive voltage potential $V_{DD}$. If the input to the gate of FET 442 is high, the FET 442 is on thereby pulling the output terminal 450 near to ground and resulting in a low output. Thus, FET 442 performs an inverting function upon the signal on line 448, resulting in circuit 420 being a NOR logic circuit.

Figure 3:
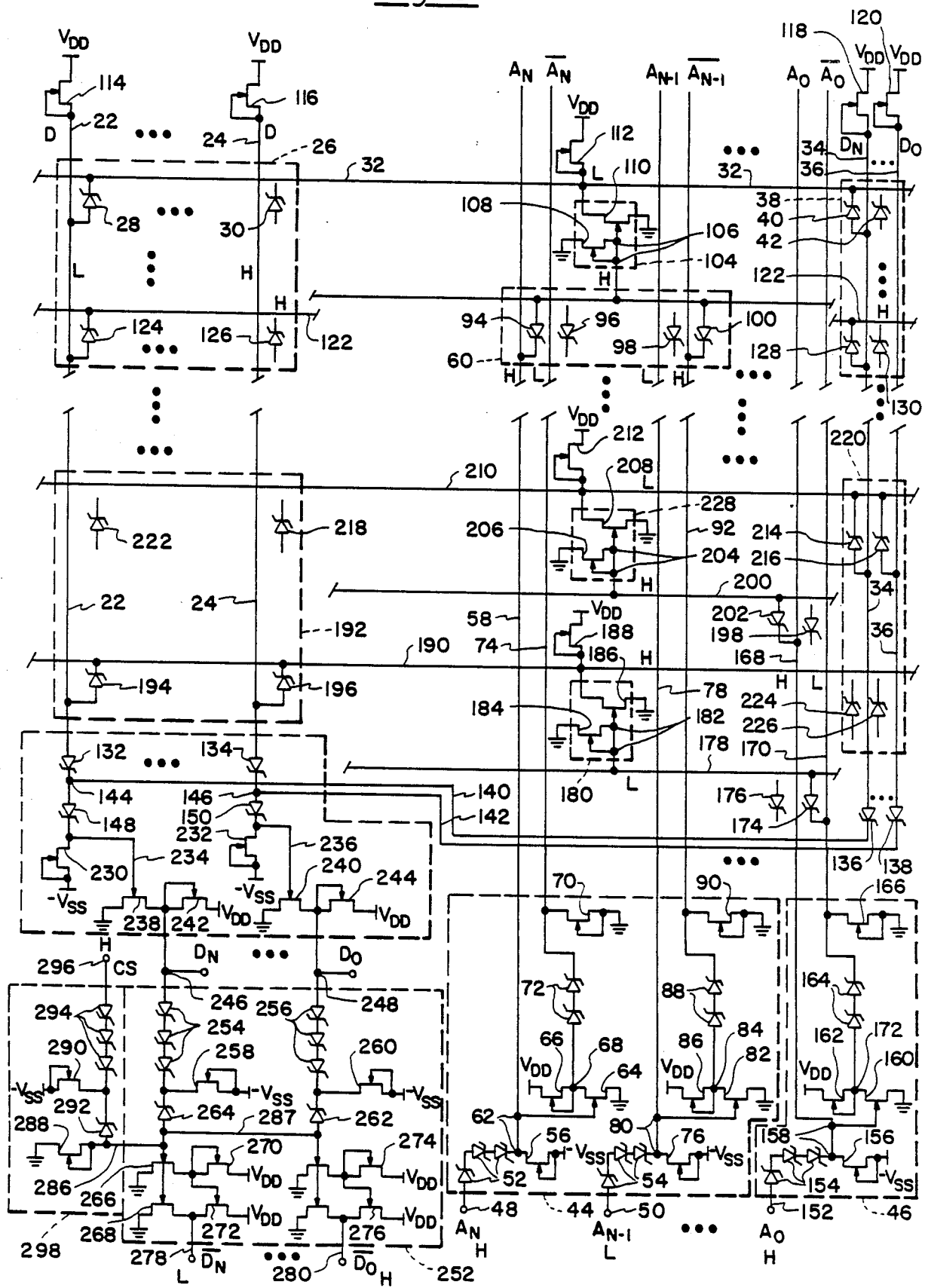
FIG. 3 is a schematic diagram of a ROM configuration of the invention.

FIG. 3 is a schematic diagram of the ROM configuration, which is uniquely designed having as active circuit components exclusively diodes and FETs. This specific embodiment ha ®Schottky diodes and metal semiconductor FET's making this configuration adaptable to GaAs integrated circuits.

The ROM configuration incorporates the above-described diode OR and AND circuits. Data are stored in this ROM configuration in a left data field 26 and a right data field 38. The individual data are stored at the intersections of bit lines 22, 24, 34 and 36 and word line 32. Whether the datum is a logic value zero or one is determined at each intersection of a bit line and a word line by a diode connection or no diode connection. In the instance of a bit line and a word line connected by a diode, the stored value is a logic value zero, and in the instance of a bit line and word line not connected by a diode, the stored value is a logic value one. For example, in FIG. 3, bit line 22 and word line 32 intersect in the left data field 26 and the value stored is a zero. The value stored at the intersection of bit line 24 and word line 32 is a one since it is not connected by diode 30. In right data field 38, the intersection of bit line 34 and word line 32 represents a value of one since the lines are not connected by diode 40 and the intersection of lines 36 and 38 represents a logic value zero since the lines are connected by diode 42.

The number of bit lines represented in FIG. 3 in the left data field 26 and the right data field 38 is merely an example of bit lines. For example, in a ROM configuration there are 160 bit lines in data field 26 and 160 bit lines in data field 38. Also, the actual ROM configuration has 512 word lines which extend into the left data field 26 and the right data field 38. In other words, each data field contains 512 words which are 160 bits long. This results in a 81,920 bit ROM.

A request for data from the ROM configuration begins with an address to address decoder drivers 44 and 46. Address decoder drivers 44 ultimately select the specific word line which contains the data in the left data field 26 and the right data field 38 to be read out. Since there are 512 word lines, each address input to inputs 48 and 50 must be unique enough in order to address one specific word line. Inputs 48 and 50 are merely representative. Utilizing a binary address of logic values one and zero and various combinations of it into address decoder drivers 44, at least nine inputs would be required for individually addressing 512 word lines via the address decoder drivers 44. The additional inputs would have the same circuitry as inputs 48 and 50.

An address of two inputs for addressing word line 32 is shown here for illustrative purposes. A high or one logic signal is input to terminal 48 and a low or zero logic signal is input to terminal 50. The one logic signal consists of a positive voltage potential and the zero logic signal consists of a zero voltage potential. The logic value one input to terminal 48 goes through three voltage level shift diodes 52, from anode to cathode, in series. The diodes 52 adjust the voltage level for the circuitry of the address decoder driver 44. The third diode 52 has its cathode connected to the drain of FET 56. FET 56 has its gate and source connected to a minus voltage source $-V_{SS}$. FET 56 and voltage source $-V_{SS}$ constitute a current sink.

At node 62, the voltage level diode 52 and FET 56 are connected to an address line 58. Line 58 goes up to word line driver decoder 60 for word line driver 104 which selects word line 32. There are 511 other decoders like decoder 60 for selecting the other 511 word lines. Address line 58 enters all of the word line driver decoders. In this particular case, address line 58 is carrying a logic one value, i.e., a positive voltage to word line driver decoder 60. Also connected to line 58 in the vicinity of node 62 is the gate of FET 64. FET 64 functions as a switching transistor and a signal inverter. The source of FET 64 is connected to a zero voltage potential, i.e., ground. The drain of FET 64 is connected to the gate and source of FET 66 at node 68. The drain of FET 66 is connected to a positive voltage potential $V_{DD}$. FET 66, in combination with positive voltage potential $V_{DD}$, constitutes a constant current source at node 68. The signal input at input 48 becomes inverted at node 68. Also, the signal from input 48 to node 68 incurs a one gate delay in FET 64. The inverted signal at node 68 goes on through two voltage level shift diodes 72 connected in series, and on to address line 74. Address line 74 is connected to the cathode of diode 72 and to the drain of a FET 70. The gate and the source of FET 70 are connected to a zero voltage potential, i.e., ground.

FET's 56, 66 and 70 are active loads at their respective places in the circuit of the address decoder driver 44 corresponding to input 48. The zero logic signal or low voltage signal on address line 74 goes to all the other word line driver decoders in addition to word line driver decoder 60.

The second address signal to address decoder drivers 44 is a low or zero logic value into input 50. The signal goes through three voltage level shift diodes 54 from anode to cathode in series to node 80. The drain of a FET 76 is connected to node 80. The gate and source of FET 76 are both connected to a negative voltage potential $-V_{SS}$. An address line 78 is connected at node 80 and carries the low signal from input 50 through voltage level shift diodes 54 on up to word line driver decoder 60 and all of the other word line driver decoders of the ROM configuration. Connected to line 78 in the vicinity of node 80 is the gate of FET 82 which functions as a switching transistor and an inverter of the signal at node 80. The source of FET 82 is connected to a zero voltage potential, i.e., ground. The drain of FET 82 is connected to node 84. The gate and source of FET 86 are connected to node 84. The drain of FET 86 is connected to a positive voltage potential $V_{DD}$. The combination of FET 86 and voltage positive potential $V_{DD}$ constitute a constant current source. The low signal at input 50 is a high signal at node 84 with a one gate delay of FET 82. With a low input, FET 82 is effectively off and node 84 exhibits a high signal due to the pull-up FET 86 and positive voltage potential $V_{DD}$. The high logic signal at node 84 goes through two voltage level shift diodes 88 from anode to cathode to anode to cathode onto address line 92. The high logic signal on address line 92 goes onto word line driver decoder 60 and all other word line driver decoders in the ROM configuration.

A FET 90 in the address decoder driver 44 corresponding to input 50, has its drain connected to address line 92 and the cathode of voltage level shift diode 88. The gate and the source of FET 90 are both connected to zero potential, i.e., ground. FET's 76, 86 and 90 function as active loads in the address decoder driver circuit 44.

The word line driver decoder 60 of FIG. 3 is illustrated in terms of operation. The address signal at input 48 of address decoder driver 44 is represented on line 58 as the same signal and the complement of that input signal at input 48 is represented on address line 74. The address signal into input 50 of address decoder driver 44 is represented as the same signal on address line 78 and its complement is represented on address line 92. As noted, the address signals into inputs 48 and 50 of address decoder drivers 44 are a logic high and a logic low, respectively, i.e., a logic one and a logic zero. This address is represented on lines 58, 74, 78 and 92, as a high, low, low, and high, respectively. These signals on the lines are indicated in FIG. 3 by the letters "H" and "L" for high and low signals, respectively.

Address lines 58, 74, 78 and 92 form intersections with word line driver decode line 102. Of the complementary pair of address lines 58 and 74, only on is connected to the word line driver decode line 102 with a diode 94 or 96. The complementary address lines 78 and 92 intersect the word line driver decode line 102. Only one of the complementary address lines 78 and 92 is connected to word line driver decode line 102 by a diode 98 or a diode 100. Diodes 94, 96, 98 and 100 are decode diodes. The selection of which diode for connecting decode line 102 to address line 58 or 74, and 78 or 92, determines the address required at inputs 48 and 50 of address decoder drivers 44 for the purpose of selecting word line driver 32 and its respective data of data fields 26 and 38. As for the complementary address lines 58 and 74, decode diode 94 is connected with its cathode to line 58 and its anode to word line decode line 102. Decode diode 96 is left disconnected with respect to address line 74. Whatever the state of address line 74 is, it does not affect word line driver decoder 60 for driver 104, since there is no connection between the two.

The other part of the address coming into address decoder drivers 44 is a low at input 50. A low at input 50 results in a low on address line 78. Since decode diode 98 is disconnected from line 78 and word line driver decode line 102, address line 78 has no effect on the word line driver decoder 60 for driver 32. The low signal at the input of 50 goes through voltage level shift diodes 54 to node 80. Because the signal is low at node 80 and the gate of FET 82 is, in effect, turned off. Thus, node 84 and the drain of FET 82 are high due to the pull-up FET 86 which is tied to the positive voltage $V_{DD}$. The high signal goes through the two voltage level shift diodes 88 and up onto address line 92. A high signal is seen by the word line driver decoder 60 for word line driver 32. The signal on address line 92 does affect word line driver decode line 102 since decode diode 100 connects lines 92 and 102.

Figure 5:
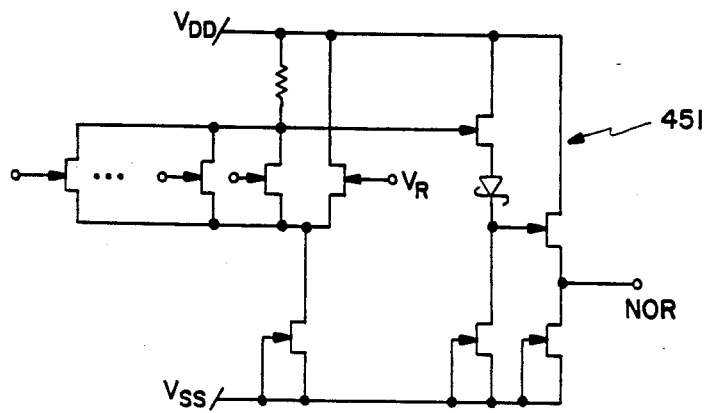
FIG. 5 illustrates a source-coupled FET logic circuit.

Note that the address decoder driver circuit 44 and 46 may not be needed if the addresses coming into the ROM 12 include both the true and complement logic levels. This approach would eliminate one gate delay in ROM 12. In the case of this ROM design integrated on a chip with source-coupled FET logic (SCFL) circuits, as illustrated by an SCFL circuit 451 in FIG. 5, at the address inputs, the section of address decoder driver circuits 44 and 46 is not needed because the SCFL circuit 451 provides both the true and complement logic levels of an address. These complementary signals can be used to directly address the word line driver decoder 60 of ROM 12.

Address lines 58 and 92 are hooked up to line 02 in a logic AND configuration. That means for line 102 to be high both lines 58 and 92 must be high. Assume line 92 to be low. Then the high voltage on line 102 causes current to conduct through diode 100 and line 102 becomes low with the exception of a small voltage drop across diode 100. The same applies when line 58 is low and line 92 is high; line 58 pulls down line 102 through conduction of diode 94. Thus, both lines 58 and 92 must be high for line 102 to be high. For this state to be accomplished, then the address into inputs 48 and 50 of address decoder drivers 44 must be a high and a low, correspondingly. Of course, in the actual ROM configuration, there are nine pairs of complementary lines. One needs a unique nine bit input address so that line decoder 60 can select word line 32. With the appropriate address, the decoder 60 causes line 102 to go from a low to a high state, that in turn raises the voltage from a low to a high state at node 106 in a driver 104. A pull-up FET 108 has its drain connected to ground and its gate and source connected to the line which is part of node 106. FET 108 pulls-up line 102. Thus, when line 102 is high, none of the decode diodes in the decoder 60 conducts current as a result of any low address lines connected by the decode diodes to word line driver decode line 102. The gate of FET 110 is connected to node 106. The high signal is on line 102 and node 106, FET 110, functioning as a switching transistor and inverter, turns on, causing word line 32 to go low. FET 110 has its drain connected to word line 32 and its source connected to a zero voltage, i.e., ground.

FET 112 is a pull-up transistor which has its drain connected to a positive voltage potential $V_{DD}$. FET 112 has its gate and source connected to word line 32, which hold the voltage on word line 32 at a high when FET 110 is off.

Word line 32, being at a low voltage state, indicates that a data selection is being made from data fields 26 and 38. All bit lines are at a high state when not selected. When word line 32 is at a low state, an indication of selection, then diode 28 indicating a zero state of logic value at that memory cell turns on. Current flows through diode 28 from bit line 22 to word line 32 thereby changing the state of bit line 22 from a high logic value to a low logic value. The unconnected diode 30 indicates a high or one logic value. The data for word line 32 is noted on bit lines 22 and 24 as zero and one logic values, respectively. Also, the bit lines 34 and 36 of data field 38 are selected by word line 32. The memory cell diode 40 is unconnected indicating a one logic value and the memory cell diode 42 is connected indicating a zero logic value. The low state of the selector word line 32 pulls down the bit line 36, thus giving an indication of zero logic value. When word line 32 or any other word line is not selected, the normal state of the bit lines is high.

FET's 114 and 116 are pull-up transistors for bit lines 22 and 24. FET's 114 and 116, respectively, have their drains connected to a positive voltage potential $V_{DD}$. The gates and sources of FET's 114 and 116 are connected to bit lines 22 and 24, respectively. FET's 118 and 120 are pull-up transistors for bit lines 34 and 36, respectively, keeping them in a high state under a nonselection state. FET's 118 and 120 have drains connected to a positive voltage potential $V_{DD}$. The gates and sources of FET's 118 and 120 are connected to bit lines 34 and 36, respectively.

Word line 122 is in a nonselected state or at a high or one logic value. Memory cell diodes 124, 126, 128 and 130 have significance as to the data stored in those places when word line 122 is selected, i.e., at a low state. If selected, only then do diodes 124 and 128 turn on, putting bit lines 22 and 34 to a low state, indicating a zero logic value. Diodes 126 and 130 are not functional due to their being unconnected, letting bit lines remain at a high state, indicating a one logic value. It may be noted that the address which selects either word line 32 or word line 122 is unique and therefore only one word line can be selected at a time.

Data from data fields 26 and 38 coming down bit lines 22, 24, 34 and 36 are joined together in an OR function in the order of bit lines of the respective data fields 26 and 38. The datum on bit line 22 goes through OR diode 132 and the datum on bit line 34 goes through OR diode 136 and along line 140 to node 144 where it meets with the datum of bit line 22. The same occurs with data on bit line 24 and bit line 36. The datum from bit line 24 goes through OR diode 134 out onto node 146 and the datum from bit line 36 goes on through OR diode 138, along line 142, onto node 146. The data at nodes 144 and 146 go through diodes 148 and 150, respectively. The information for both pairs of bit lines is OR-ed.

It is required that data from only one data field 26 or 38 be on nodes 144 and 146 at one time. This situation is achieved by a selection of only one data field 26 or 38 and thus allowing data from only one data field to be present on nodes 144 and 146 at one time.

Specific data field or memory array selection is achieved by a signal at input 152 of data field selector driver 46. Data field or memory array selector driver 46 may also be referred to as an address decoder driver 46 being grouped together with address decoder drivers 44 since a signal to the input 152 is a part of the address incorporating inputs 48, 50, and so on. A high or one logic value signal at input 152 selects data field 26 and a low or zero logic input into input 152 of driver 46 selects data field 38. For instance, a high signal, put into input 152, goes through three voltage level shifting diodes 154 which are connected in series in the direction of anode to cathode with the signal entering the anode side of the diodes. The data field or memory array selector signal next arrives at node 158 which is connected to the drain of pull-down FET 156. FET 156 has its source and drain connected to a negative voltage potential $-V_{SS}$. The signal at 158 goes down data field address line 168 as a high or one logic signal. The signal on node 158 also goes to the gate of a switching FET 160. FET 160 has its source connected to a ground or zero voltage potential. The drain of FET 160 is connected to node 172. A pull-up FET 162 has a drain connected to a positive voltage potential $V_{DD}$. FET 162 has a gate and source connected to node 172. Since the signal at gate of FET 160 is high, FET 160 is turned on and node 172 is at approximately a ground potential or a low or zero logic value. This low signal goes on through two voltage level shifting diodes 164 which are connected in series cathode to anode with the signal going through the diodes from anode to cathode out on to data field address line 170. The drain of FET 166 is connected to the output of driver 46 which is connected to data field address line 170. The gate and source of FET 166 is connected to a zero voltage potential, i.e., ground.

The low signal on line 170 goes to diode 174 causing field select decode 174 to turn on and to pull field select driver decode line 178 to a low state. Decode diode 176 is disconnected since one has a choice of selecting a high signal from 168 or a low signal from 170 for a given high logic value at input 152 of driver 46 since lines 168 and 170 are complementary lines. The low signal on line 178 is seen on node 182 of field select line driver 180. A pull-up FET 184 has a drain connected to a ground and its gate and source connected to node 182. The low signal on node 182 goes into a gate of a switching FET 186. Switching FET 186 has a source connected to a zero voltage potential, i.e., ground, and a drain connected to field select line 190. Connected to field select line 190 is a source and a gate of a pull-up FET 188. FET 188 has its drain connected to a positive voltage potential $V_{DD}$. Since the low signal shuts off FET 186 the potential on field select line 190 is high due to the pull-up FET 188.

Field select line 190 is connected to cathodes of field select diodes 194 and 196 in field selector 192. The anode of field select diode 194 connected to data bit line 22 and the anode of field select diode 196 is connected to bit line 24. Thus, when the signal on field select line 190 is high, then bit lines 22 and 24 may be either high or low because if bit line 22 or 24 is low, diodes 194 and 196 are back-biased and thus have no effect on the signals on bit lines 22 and 24. However, if the signal on field select line is low, then diodes 194 and 196 are forward-biased and thus hold bit lines 22 and 24 down to a low signal, preventing the exhibition or reading out of data on bit lines 22 through 24, i.e., data field 26, of any selected word line, viz., 32 or 102.

A low signal on field select line 190 corresponds to a low signal on input 152 of driver 46. Assume, as indicated in FIG. 3, that a high signal "H" is on input 152 of driver 46, thus resulting in a high on field select line 190 thereby allowing data to read out of data field 26. One may look at the effect of the output of driver 46 on data field 38. Having a high on input 152 results in a high logic signal on data field address line 168. Line 168 is connected to field select driver decode line 200 through a field select decode diode 202 having its cathode connected to data address line 168 and its anode connected to field select driver decode line 200. Since line 200 is normally high due to a pull-up FET 206, diode 202 has a significant effect only when line 168 is a low therefore forward-biasing the diode and pulling line 200 down to a low. That happens only if a low is at input 152 of driver 46.

If the input to 152 of driver 46 is designated as a high "H" in FIG. 3, a high exists on lines 168 and 200. The gate and source of FET 206 are connected to node 204 which, in turn, is connected to line 200. The drain of FET 206 is connected to a ground. The high signal of field select driver decode line 200 goes into field select line driver 228 onto a gate of a switching FET 208. FET 208 has a source connected to ground and a drain connected to field select line 210. Field select line 210 is connected to a gate and source of a pull-up FET 212. The drain of FET 212 is connected to a positive voltage potential $V_{DD}$. Pull-up FET 212 causes field select line 210 to be normally high. However, since switching FET 208 is switched on due to a high at its gate, FET 208 conducts thus causing field select line 210 to go to a low. Field select line 210 has no effect on data field 26 since field select diodes 218 and 222 are not connected between line 210 and bit lines 22 and 24. However, field select line 210 is connected to bit lines 34 and 36 of data field 38 through field select diodes 214 and 216 in field selector 210. Diodes 214 and 216 have cathodes connected to field select line 210 and anodes connected to data bit lines 34 and 36, respectively. If data bit line 34 or 36 is supposed to be high it is brought down to a low signal if field select line 210 is low due to the forward-biasing of diodes 214 and 216. Since field select diodes 214, 216 and other diodes correspondingly connected to all the data bit lines of data field 38, cause all of the bit lines to be low, then no data can effectively be read out of data field 38. Field select diodes 224 and 226 are present in case an alternative connection is desired in lieu of diodes 214 and 216 to the bit lines 34 and 36 respectively of data field 38. Overall, it can be noted that if there is a high signal on input 152 of driver 46 data field 26 is selected and data field 38 is precluded from exhibiting data. Alternatively, if a low signal is put into 152 of driver 46 data field 38 is selected for data and one is precluded from obtaining data from data field 26.

The byte size of data read is equal to the number of bit lines in either the left or right data field array. The byte size ca be reduced by adding more sets of field selectors like those of 220 and 192 along with associated lines and drivers.

In the example of FIG. 3 there is only two memory arrays drawn. Theoretically there is no limit in the number of memory arrays being implemented. Practically, the ROM can be designed with 16 memory arrays easily, because the data bit of each memory array will be OR-ed together to produce one output datum.

Circuit 250 contains OR junctions of corresponding bit lines of the field arrays 26 and 38. The OR function is described above in conjunction with FIGS. 1 and 2. The output of the respective selected bit lines 22 and 24, or 34 and 36, are fed through diodes 148 and 150, respectively, onto lines 234 and 236. FET's 230 and 232 have their gates and sources connected to a negative voltage potential $-V_{SS}$. The drain of FET 230 is connected to the cathode of diode 148 and to line 234. FET 232 has a drain connected to the cathode of diode 150 and to line 236. The bit line signal on line 234 goes on to the gate of a switching FET 238. In this particular example, the signal on bit line 22 is low and goes through diodes 132 and 148 on to line 234 to the gate of FET 238, thus turning off FET 238. The drain of FET 238 is connected to a zero voltage potential, i.e., ground, and the source is connected to an output terminal 246 of circuit 250. Also connected to the source of FET 238 are the gate and source of FET 242. The drain of FET 242 is connected to a positive voltage potential $V_{DD}$. Since FET 238 is turned off by the low signal of bit line 22, the output 246 exhibits a high signal.

Bit line 24 has a high signal which goes through diodes 134 and 150 on to line 236 which is connected to the gate of FET 240. FET 240 has a source connected to ground and a drain connected to an output terminal 248 of circuit 250. Also connected to the drain of FET 240 are a gate and a source of FET 244. FET 244 has a drain connected to a positive voltage potential $V_{DD}$. The high signal on bit line 24 which goes along line 236, turns on FET 240 thereby causing output 248 to be low.

The high signal at output 246 from circuit 250 goes into an inverter and buffer circuit 252 through a series of three voltage level shift diodes 254 from anode to cathode onto a drain of a pull-down FET 258. FET 258 has a gate and a source connected to a negative voltage potential $-V_{SS}$. The high signal on the drain of FET 258 goes on through diode 264 from cathode to anode and on to the gates of FET 266 and FET 268. The sources of FET 266 and FET 268 are connected to a zero voltage potential, i.e., ground. The drain of FET 266 is connected to the gates of FET's 270 and 272 and to the source of FET 270. The drains of FET's 270 and 272 are connected to a positive voltage potential $V_{DD}$. The drain of FET 268 is connected to the source of FET 272 and to output terminal 278 of inverter and buffer circuit 252. The high signal at input 246 of circuit 252 which goes on through the voltage level shift diodes 254 and diode 264 onto the gates of FET's 266 and 268, turns on the latter FET 268 resulting in a low output signal at terminal 278.

The low signal at terminal 248 going into circuit 252 goes through three voltage level shift diodes 256 from anode to cathode and then onto a drain of FET 260 and a cathode of diode 262. The gate and source of FET 260 are connected to a negative voltage potential $-V_{SS}$. The anode of diode 262 is connected to gates of FET's 282 and 284. The sources of FET's 282 and 284 are connected to a zero voltage potential, i.e., ground. The drain of FET 282 is connected to gates of FET's 274 and 276 and to the source of FET 274. The drains of FET's 274 and 276 are connected to a positive voltage potential $V_{DD}$. The drain of FET 284 is connected to the source of FET 276 and to output terminal 280 of circuit 252. The low signal "L" at terminal 248, going on through diodes 256 and 262 to the gates of FET's 282 and 284, turns off FET's 282 and 284 resulting in a high signal on terminal 280.

Data are read out on terminals 278 and 280 if lines 286 and 287 from enable circuit 298 are such that the data signals to the gates of FET's 266, 268, 282 and 284 are not blocked. If there is no high enable signal at terminal 296, then a pull-down FET 290, having a gate and a source connected to a negative voltage potential $-V_{SS}$ and a drain connected to the cathode of diode 292, holds the cathode of diode 292 at a low voltage. Current from the source of FET 288 flows through forward-biased diode 292 to FET 290. FET 288 has a drain connected to a zero voltage potential, i.e., ground, and a gate and a source connected to lines 286 and 287. Lines 286 and 287 are connected to the gates of FET's 266 and 282. The current flow through FET's 288 and 290 results in a low voltage potential on lines 286 and 287 and presents a low signal at the gates of FET's 266, 268, 282 and 284, thereby blocking data to output terminals 278 and 280 and resulting in high signals on the output terminals 278 and 280.

To enable the memory so that data is present on terminals 278 and 280, a high signal is put into terminal 296 of enable circuit 298. The high signal goes from anode to cathode through three voltage level shifting diodes 294 which are connected in series. The high signal at the cathode of the third voltage level shifting diode 294 goes on to the drain of FET 290 and the cathode of diode 292. Current flows through FET 290 on to the negative voltage potential $-V_{SS}$. The voltage potential at the drain of FET 290 is high enough to back-bias diode 292 so that diode 292 does not conduct current and thereby hold the voltage potential low on lines 286 and 287. The signals on lines 286 and 287 may vary freely, being either high or low.

Figure 4:
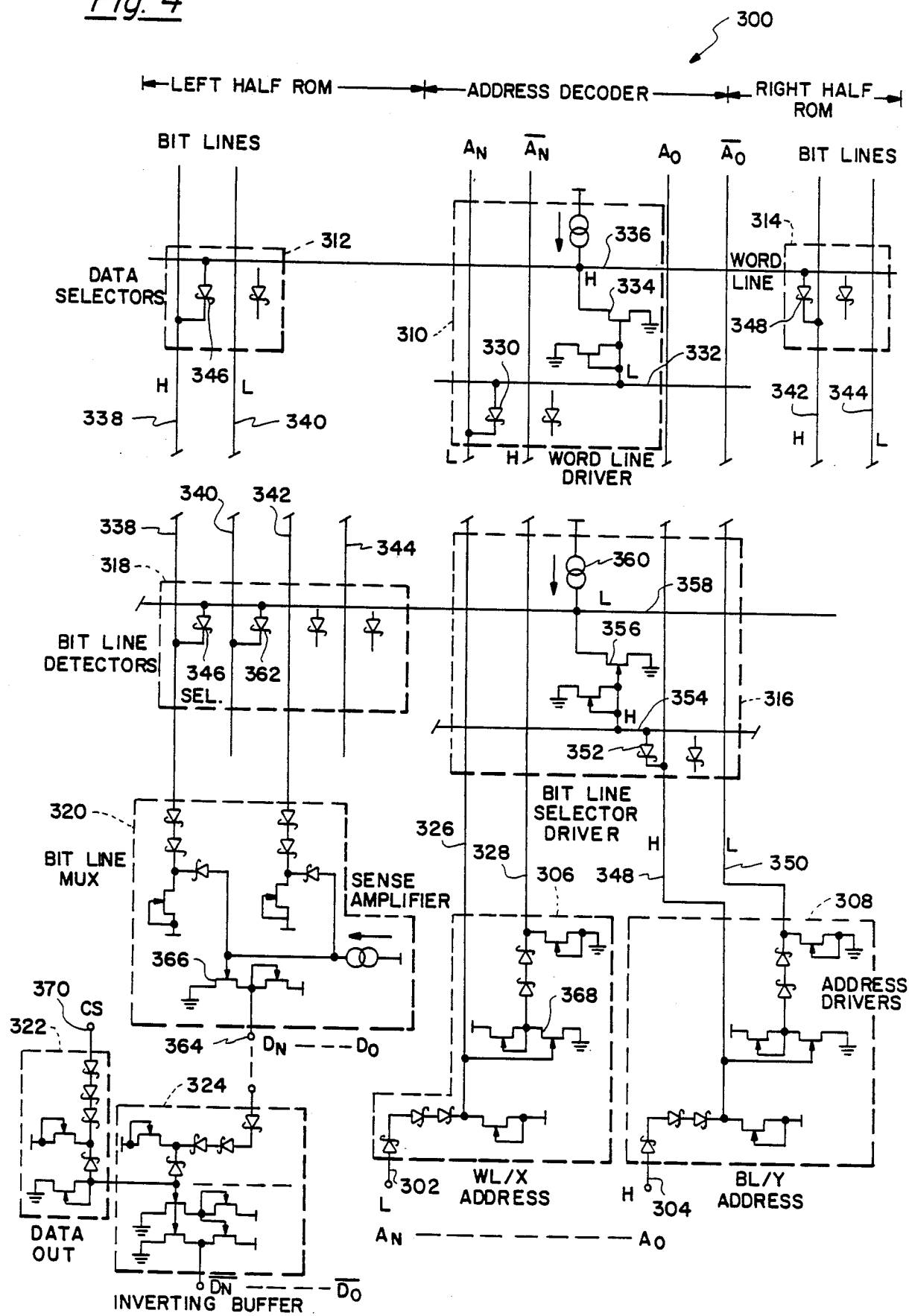
FIG. 4 is a schematic diagram of another ROM configuration.

Another ROM configuration 300 in FIG. 4 has several portions of circuitry which utilize logic which is the obverse of logic utilized in corresponding portions of the ROM configuration 12 described above in FIG. 3. Configuration 300 of FIG. 4, like configuration 12 in FIG. 3, uniquely implements diode logic described above in conjunction with FIGS. 1 and 2.

For illustrative purposes, a low address signal is entered at input 302 of the word line address driver 306. The word line address driver 306 functions similarly as word line address driver 44 in FIG. 2. The output of the word line address 306 is a low output corresponding to the low input at 302 and a complementary output which is a high, i.e., an inversion of the input. The low signal out of word line address driver 306 goes down address line 326 and the inverted output of address driver 306 goes down the address line 328. Line 328 is not connected to anything within word line driver 310. However, the low signal going down 326 affects the decode diode 330 which turns on and pulls the word line driver decode line 332 from a normally high state to a low state thereby turning off FET 334 which causes a normally low word line 336 to go to a high state. Word line 336 extends into the left half ROM 312 and the right half ROM 314. The high state of word line 336 forward biases a memory cell diode 346 thus raising bit line 338 from a low to a high state. Word line 336 also raises bit line 342 from a low to a high state through the forwardbiased memory cell diode 348. The other bit lines intersected by word line 336 but not interconnected with a memory cell diode remain in a low state.

The data from the bit lines of either the left half ROM 312 or the right half ROM 314 are selected according to a half ROM one at a time. This selection is made with a bit line selector 318 which is driven by the bit line selector driver 316. Selector driver 316 is in turn driven by address driver 308. For instance one may input a high signal to input 304 of address driver 308. Address driver 308 works similarly in function to driver 46 in FIG. 3. The high noninverted output of driver 308 goes on down address line 348 which is connected to bit line selector decode line 354 by decode diode 352. Decode diode 352 is not forward-biased because of the normally high state of the bit line selector decode line 354. Thus, FET 356 is on and the bit line selector driver line 358 is low. The low line 358 does not turn on the bit line selector diode 346 since it is backed-biased as it is connected to a high bit line 338. Line 358 also has a diode connected to bit line 340. As long as line 358 is low data may pass from the left half ROM 312 on out to the bit line multiplexer and sense amplifier 320.

However, if the address signal to input 304 of address driver 308 is low, the corresponding output on line 348 is low causing diode 352 to conduct pulling line 354 low and thus turning off FET 356 and allowing line 358 to go to its normally high state due to the pull-up effect of the current source 360. Due to the high state of line 358, diodes 346 and 362 turn on if either bit line 338 or 340 is low. Thus, in this state all bit lines of the left half ROM 312 are high and no data will pass from the left half ROM. Similar to the ROM configuration 12 of FIG. 3, the left half ROM 312 and the right half ROM 314 are wired such that, whatever the address signal input at 304 of address driver 308, one half ROM will be in such a state that its data may be read out from its bit lines and the other half ROM will be in such a state that no data may be read out from its bit lines. The set of bit lines for the left half ROM 312 and the set of bit lines from right half ROM 314 are fed into a bit line multiplexer and sense amplifier 320. They are connected in an AND configuration and the output of the bit lines of the half ROM being read is inverted and exits at output 364 of the bit line multiplexer and sense amplifier 320.

It may be noted that there are only two gate delays from the point of address input at 302 of word line address driver 306 to the output point 364 of the bit line multiplexer and sense amplifier 320. The first gate delay is FET 334 in word line driver 310 and the second delay is in FET 366 of bit line multiplexer and sense amplifier 320. However, if word line driver 310 is to depend on a signal on address line 328, there is an additional gate delay at the inverting FET 368 in address driver 306.

The memory data output at terminal 364 may be connected to an inverting buffer 324. An additional gate delay results in running the signal through inverting buffer 324. Connected to inverting buffer 324 is an enabling circuit 322. An enabling signal is fed into input 370 for enabling the ROM configuration 300 at the inverting buffer 324 for the reading out of data. Enabling circuit 322 functions similarly to enabling circuit 298 of FIG. 3. Likewise, inverting buffer 324 functions like inverting buffer 252 of FIG. 3.

The embodiments of the invention in which an exclusive property of right is claimed are defined as follows:

1. An exclusive diode-FET read-only memory, having a two-to-three gate delay, comprising:
   a first plurality of conductive means for conducting signals;
   a second plurality of conductive means for conducting signals, in proximity with said first plurality of conductive means;
   a first plurality of diodes, each electrically connecting a unique pair of one of said conductive means of said first plurality and one of said conductive means of said second plurality, thereby storing a datum of information;
   a first plurality of drivers wherein each driver has an output electrically connected to one of said conductive means of said first plurality of conductive means;
   a third plurality of conductive means for conducting signals, wherein each of said conductive means of said third plurality is connected to an input of one of said first plurality of drivers;
   a fourth plurality of conductive means for conducting signals, in proximity with said third plurality of conductive means;
   a second plurality of diodes, each electrically connecting a unique pair of one of said conductive means of said third plurality and one of said conductive means of said fourth plurality; and
   a second plurality of drivers wherein each driver has an output connected to at least one of conductive means of said fourth plurality of conductive means, and each said driver, upon receipt of an external address, impresses at least one electrical signal onto one of conductive means of said fourth plurality of conductive means and, via one diode of said second plurality of diodes, onto one of conductive means of said third plurality of conductive means, which addresses and selects one of said first plurality of drivers which in turn affects the electrical state of a particular one of said conductive means of said first plurality of conductive means, thereby revealing certain stored data of information.

2. Apparatus according to claim 1 further comprising:
   a memory array selector connected to said second plurality of conductive means; and
   output multiplexer and interface means, connected to said second plurality of conductive means, for multiplexing and interfacing data signals.

3. Apparatus according to claim 2 further comprising:
   positive voltage means;
   ground means; and
   negative voltage means.

4. Apparatus according to claim 3 wherein:
   each driver of said first plurality of drivers comprises a first and second field effect transistor, each having a gate, a drain, and a source, said drain of said first field effect transistor being electrically connected to only one said conductive means of said first plurality of conductive means and to a current source which is connected to said positive voltage means, said source of said first field effect transistor being connected to said ground means, said gate of said first field effect transistor being connected to said drain and gate of said second field effect transistor, said source of said second field effect transistor being connected to said ground means, and said gate of said first field effect transistor being connected to one conductive means of said third plurality of conductive means, and said current source comprising a third field effect transistor having a drain connected to said positive voltage means, and a gate and a source connected to said drain of said first field effect transistor; and
   each driver of said second plurality of drivers comprises a voltage level shifting means for changing voltage levels and an inverting means for inverting signals, said voltage level shifting means comprising first, second and third diodes connected in series from cathode to anode, having anode of said first diode connected to an address input, and having cathode of said third diode connected to a conductive means of said fourth plurality and connected to a drain of a first field effect transistor having a source and a gate connected to said negative voltage means, said inverting means comprising a second field effect transistor having a gate connected to said drain of said first field effect transistor, a source connected to said ground means, a drain connected to a source and to a gate of a third field effect transistor, and to an anode of a fourth diode, a drain of said third field effect transistor connected to said positive voltage means, cathode of said fourth diode connected to an anode of a fifth diode, cathode of said fifth diode connected to a drain of a fourth field effect transistor and to a conductive means of said fourth plurality of conductive means, and a gate and a source of said fourth field effect transistor connected to said ground means.

5. Apparatus according to claim 4 wherein:
   each of said first plurality of diodes has its anode and cathode connected to said unique pair of one of said conductive means of said first plurality and one of said conductive means of said second plurality, in that order, but not all of said conductive means of said first plurality is necessarily interconnected by a diode of said first plurality of diodes to a conductive means of said second plurality of conductive means; and
   each of said second plurality of diodes has its anode and cathode connected to said unique pair of one of said conductive means of said third plurality and one of said conductive means of said fourth plurality, in that order, but not all of said conductive means of said third plurality is necessarily interconnected by a diode of said second plurality of diodes to a conductive means of said fourth plurality of conductive means.

6. Apparatus according to claim 5 wherein said memory array selector comprises:
   a fifth plurality of conductive means for conducting signals, in proximity with said second plurality of conductive means;

a third plurality of diodes, each electrically connecting only one conductive means of said fifth plurality of conductive means to every conductive means of said second plurality of conductive means of only one array of said circuit configuration, being selected for providing said functionally read-only memory output;

a third plurality of drivers wherein each driver has an output electrically connected to one conductive means of said fifth plurality of conductive means;

a sixth plurality of conductive means for conducting signals;

a seventh plurality of conductive means for conducting signals, in proximity with said sixth plurality of conductive means;

a fourth plurality of diodes, each electrically connecting a unique pair of one of said conductive means of said sixth plurality and one of said conductive means of said seventh plurality; and a fourth plurality of drivers wherein each driver has an output connected to at least one of conductive means of said sixth plurality of conductive means so that, upon receipt of an external address, each said driver impresses at least one electrical signal via at least one of conductive means of said sixth plurality of conductive means and one diode of said fourth plurality of diodes onto one conductive means of said seventh plurality of conductive means which addresses and selects one of said third plurality of drivers which in turn affects the electrical state of a particular one of said conductive means of said fifth plurality of conductive means, thereby selecting a particular memory array and making externally available, data stored in said selected memory array.

7. Apparatus according to claim 6 wherein said output multiplexer and interface means comprises a plurality of sense amplifier means for sensing data signals, each having a first diode connecting conductive means of said second plurality of conductive means to a drain of a first field effect transistor, said first field effect transistor having a gate and a source connected to said negative voltage means, a second diode connecting said drain of said first filed effect transistor to an output of said sense amplifier means.

8. Apparatus according to claim 7:

each driver of each third plurality of drivers of said memory array selector comprises first and second field effect transistors, each transistor having a gate, a drain, and a source, said drain of said second field effect transistor being electrically connected to only one said conductive means of said fifth plurality of conductive means and to a current source which is connected to said positive voltage means, said source of said first field effect transistor being connected to said ground means, said gate of said first field effect transistor being connected to said drain and gate of said second field effect transistor, said source of said second field effect transistor being connected to said ground means, and said gate of said second field effect transistor being connected to one conductive means of said seventh plurality of conductive means, said current source comprising a third field affect transistor having a drain connected to said positive voltage means, and a gate and a source connected to said drain of said first field effect transistor; and each driver of said fourth plurality of drivers of said memory array selector comprises voltage level shifting means for changing voltage levels and inverting means for inverting signals, said voltage level shifting means comprising first, second and third diodes connected in series, cathode to anode, having anode of said first diode connected to an address input, and having cathode of said third diode connected to a conductive means of said sixth plurality and connected to a drain of a first field effect transistor having a source and a gate connected to said negative voltage means, said inverting means comprising a second field effect transistor having a gate connected to said drain of said first field effect transistor, a source connected to said ground means, a drain connected to a source and to a gate of a third filed effect transistor and connected to an anode of a fourth diode, a drain of said third field effect transistor connected to said positive voltage means, cathode of said fourth diode connected to an anode of a fifth diode, cathode, of said fifth diode connected to a drain of a fourth field effect transistor and a conductive means of said sixth plurality of conductive means, and drain and source of said fourth field effect transistor connected to said ground means.

9. Apparatus according to claim 8 wherein said output multiplexer and interface means further comprises multiplexer switching means for switching data signals, having inputs connected to outputs of said plurality of sense amplifier means, said multiplexer switching means having a first field effect transistor with a gate connected to said inputs of said mutiplexer switching means and to a current source, a source of said first field effect transistor connected to said ground means, a drain of said first field effect transistor connected to a gate and a source of a second field effect transistor, a drain connected to said positive voltage means, and said drain of said first field effect transistor connected to an output of said multiplexer switching means, said output of said multiplexer switching means being a data output for said circuit configuration of said read-only memory, and said current source comprising a field effect transistor having a source and a gate connected to said gate of said first field effect transistor, and having a drain connected to said positive voltage means.

10. Apparatus according to claim 9 wherein said diodes are Schottky diodes and said field effect transistors are metal semiconductor field effect transistors.

11. Apparatus according to claim 10 is a gallium arsenide integrated circuit.

* * * * *

UNITED STATES PATENT AND TRADEMARK OFFICE
CERTIFICATE OF CORRECTION

PATENT NO. : 4,845,679

DATED : July 4, 1989

INVENTOR(S) : Tho T. Vu

It is certified that error appears in the above-identified patent and that said Letters Patent is hereby corrected as shown below:

Column 15, line 44, delete "filed" and substitute --field--.

Signed and Sealed this

Twenty-fourth Day of April, 1990

Attest:

HARRY F. MANBECK, JR.

*Attesting Officer*      *Commissioner of Patents and Trademarks*